(12) United States Patent
Liu

(10) Patent No.: US 12,193,516 B2
(45) Date of Patent: Jan. 14, 2025

(54) PUFF DETECTION CIRCUITS AND DEVICES THEREFOR

(71) Applicant: SMART CHIP MICROELECTRONIC CO., LIMITED, Hong Kong (CN)

(72) Inventor: Loi Ying Liu, Hong Kong (CN)

(73) Assignee: SMART CHIP MICROELECTRONIC CO., LIMITED, Hong Kong (CN)

( * ) Notice: Subject to any disclaimer, the term of this patent is extended or adjusted under 35 U.S.C. 154(b) by 160 days.

(21) Appl. No.: 17/768,216

(22) PCT Filed: Sep. 23, 2021

(86) PCT No.: PCT/IB2021/058669
§ 371 (c)(1),
(2) Date: Apr. 11, 2022

(87) PCT Pub. No.: WO2022/064405
PCT Pub. Date: Mar. 31, 2022

(65) Prior Publication Data
US 2024/0090583 A1    Mar. 21, 2024

(30) Foreign Application Priority Data

Sep. 23, 2020   (HK) .......................... 32020016729.6

(51) Int. Cl.
*A24F 40/51*     (2020.01)
*G01R 27/26*     (2006.01)
*H03K 17/955*    (2006.01)

(52) U.S. Cl.
CPC ........... *A24F 40/51* (2020.01); *H03K 17/955* (2013.01); *H03K 2217/960705* (2013.01); *H03K 2217/960745* (2013.01)

(58) Field of Classification Search
CPC ....... G01R 27/26; A24F 40/51; H03K 17/955; H03K 2217/960705; H03K 2217/960745
See application file for complete search history.

(56) References Cited

U.S. PATENT DOCUMENTS

| | | | | |
|---|---|---|---|---|
| 2003/0142513 A1* | 7/2003 | Vinciarelli | .............. | H02M 1/08 363/17 |
| 2005/0068045 A1* | 3/2005 | Inaba | ................. | G01R 27/2605 324/678 |
| 2010/0225336 A1* | 9/2010 | Lin | ....................... | G01D 5/2405 324/681 |

* cited by examiner

*Primary Examiner* — Jermele M Hollington
*Assistant Examiner* — Temilade S Rhodes-Vivour

(57) ABSTRACT

A puff detection device (10) comprising a capacitive puff sensor (C2), a detection signal generator (140) for connection with the puff sensor (C2) and having an ESD diode (D2) at an input node (IN2), and a reference signal generator (120) which is configured to generate a train of reference pulses (CKI) having a reference frequency and comprises a reference capacitor (C1). The reference signal generator (120) includes a compensation device (D1) which is configured to provide a leakage current path at a charging node (IN1) of the reference capacitor (C1).

17 Claims, 6 Drawing Sheets

Figure 1:
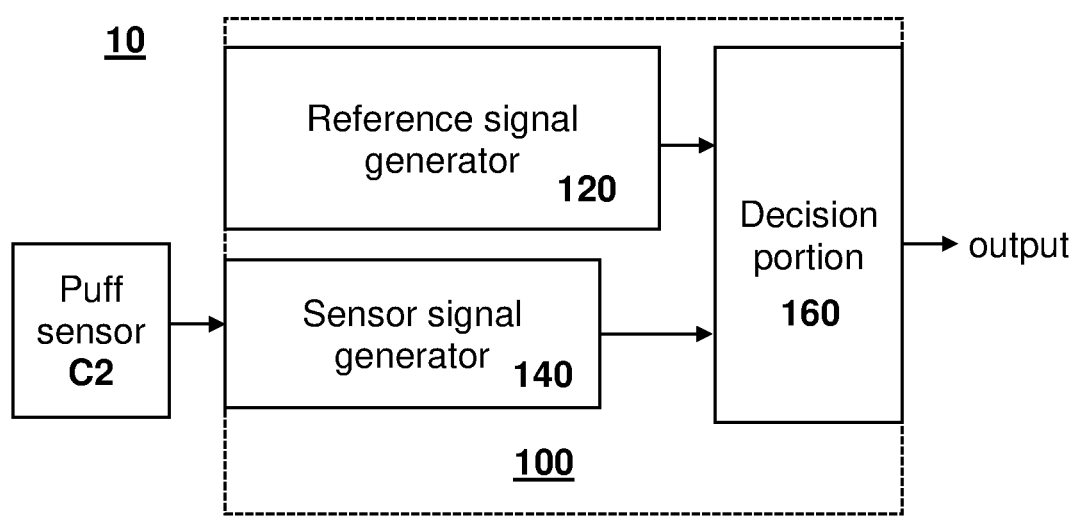

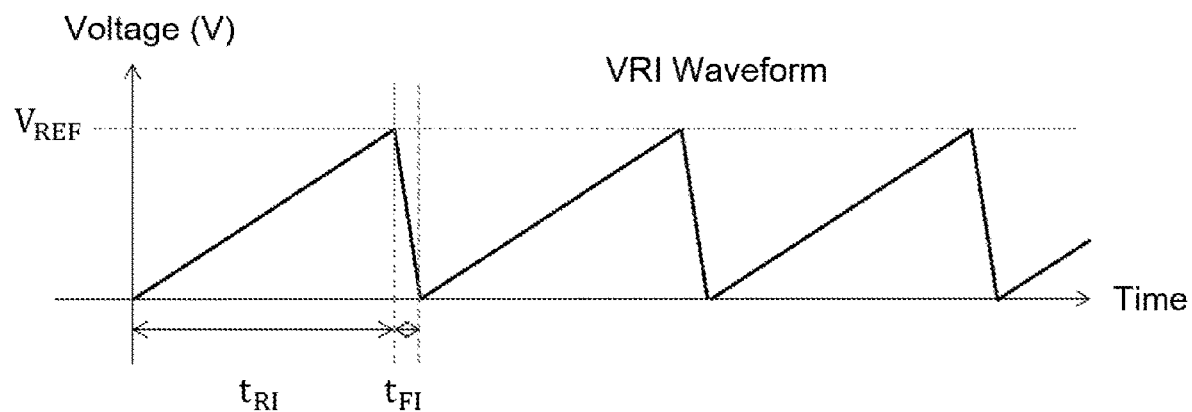
Figure 2A1
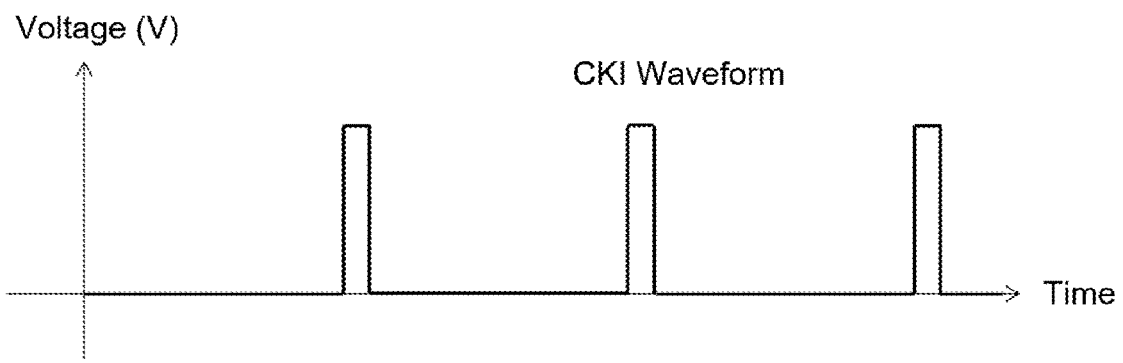
Figure 2A2

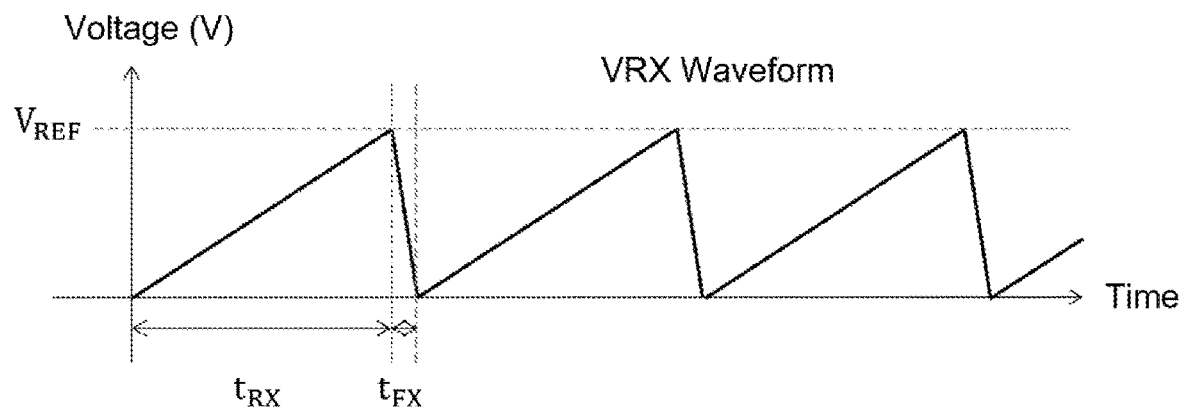
Figure 2B1
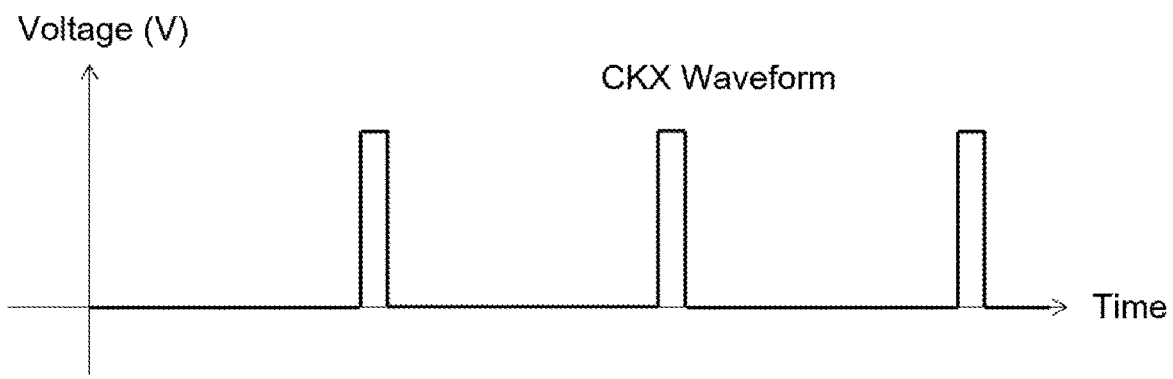
Figure 2B2

PUFF DETECTION CIRCUITS AND DEVICES THEREFOR

FIELD

The present disclosure relates to electronic vaping apparatuses, particularly to puff detection circuits of an electronic vaping apparatus, and more particularly to ADCs for use in puff detection circuits.

BACKGROUND

An electronic vaping apparatus comprises a detection circuit and a puff sensor which is connected to the detection circuit to form a puff detection arrangement, which is configured to determine whether a valid puff has appeared at the puff sensor. The detection circuit may include an analog-to-digital converter (ADC) which is to operate to convert analog signals coming out of the puff sensor to a digital form which is suitable for subsequent processing and determination by a digital circuit portion. A typical ADC receives an analogue voltage at an input terminal and outputs a digital signal. Apart from applications in electronic vaping apparatuses, ADCs also find many applications in modern day electronics, for example in detection circuits, because many decision circuits and/or control circuits require a digital input, while many properties to be sensed or detected by a detection frontend such as a sensor are analog.

An electronic vaping apparatus typically operates at elevated temperatures, for example, between 100-250° C. (212-482° F.). However, detection errors or abnormalities at elevated temperatures are often observed.

It would be advantageous to provide improved puff detection circuitry which would enhance vaping operations at elevated temperatures to mitigate non-triggering or delayed triggering.

SUMMARY OF DISCLOSURE

An electronic device, a puff detection circuitry comprising the device, and an electronic vaping apparatus comprising the puff detection circuitry are disclosed. The electronic device includes a compensation device which is configured to mitigate detection errors of a puff detection circuitry at elevated temperatures. An electronic vaping apparatus comprising the electronic device which forms an essential part of the puff detection circuitry has more predictable and stable performances at elevated temperatures.

The electronic device comprises a first signal generator and a second signal generator.

The first signal generator is a reference signal generator comprising a first capacitor which is a reference capacitor connected between an intermediate node and a circuit ground and a compensation device which is connected in parallel with the first capacitor; a first charging-and-discharging circuit which is configured to repeatedly charge and discharge the first capacitor whereby a first train of pulses having a first frequency is generated, the first frequency being a reference frequency corresponding to a first pulse count which is a reference pulse count; and wherein the first charging-and-discharging circuit comprises a first charging circuit portion which is configured to supply a first current to the intermediate node whereby the first capacitor is charged.

The second signal generator is a detection signal generator comprising an input node which is configured for making electrical connection with a capacitive sensor which is a second capacitor, a diode which is connected at the input node to function as an ESD diode to provide electrostatic discharge protection, a second charging-and-discharging circuit which is configured to repeatedly charge and discharge the second capacitor whereby a second train of pulses having a second frequency is generated when the capacitive sensor is connected to the second signal generator, the second frequency being a detection frequency corresponding to a second pulse count which is a detection pulse count.

The compensation device is configured to provide a leaking current path so that a minor portion of the first current is to flow into the compensation device as a compensational leakage current during charging cycles of the first charging circuit portion to mitigate errors arising from a change in leakage current of the ESD diode due to a change in operational temperature of the second signal generator.

The ESD diode has a leaking-current-versus-temperature trend. The compensation device may have a leaking-current-versus-temperature trend following the leaking-current-versus-temperature trend of the ESD diode in the elevated operation temperature range.

The compensation device may have a semiconductor p-n junction which is configured to be under a reversed bias when the first charging circuit portion is in a charging cycle during which the first capacitor is charged. In an example, the compensation device is configured as a diode having is cathode connected to the intermediate node and its anode connected to the circuit ground. The compensation device and the ESD diode may be monolithically formed on a single semiconductor chip.

The compensation device may be configured such that the leakage current of the ESD diode is n times the compensational leakage current of the compensation device at an elevated operation temperature of above 100 degrees Celsius, n being a positive real number between 1 and 10, including 1, 2, 3, 4, 5, 6, 7, 8, 9, 10 and a range or ranges selected from any combination of the afore-values.

The second charging-and-discharging circuit may comprise a second charging circuit portion which is configured to supply a second current to the input node whereby the second capacitor which is a sensing capacitor is charged, the second current being m times the first current and m being a positive real number between 1 and 10, including 1, 2, 3, 4, 5, 6, 7, 8, 9, 10 and a range or ranges selected from any combination of the afore-values.

The compensation device may have a p-n junction having a first p-n junction area and the ESD diode has a second p-n junction area, and wherein the second p-n junction area is n times the first p-n junction area.

The first charging circuit portion may comprise a first current source having a first p-n junction area, the second charging circuit portion comprises a second current source having a second p-n junction area which is m times the first p-n junction area; m may be ±5%, ±10%, ±15%, or ±20% of n; and n may be ±5%, ±10%, ±15%, or ±20% of m.

The first charging-and-discharging circuit may comprise a first discharging circuit portion including a first discharge switch which is configured to discharge the reference capacitor in a discharge time. The device may comprise a first switching device which is configured to activate the first discharge switch to discharge the reference capacitor when a discharge voltage appears at the intermediate node. The switching device has a response time and the discharge time is smaller than the response time.

The second charging-and-discharging circuit comprises a second discharging circuit portion including a second discharge switch which is configured to discharge the sensing capacitor in a discharge time, wherein the device comprises a second switching device which is configured to activate the second discharge switch to discharge the sensing capacitor when a discharge voltage appears at the input node, and wherein the second switching device has a response time which is larger than the discharge time. The discharge time may be 20ns or lower.

The first charging circuit portion may be configured to charge the first capacitor in a first charging time and the second charging circuit portion may be configured to charge the second capacitor in a second charging time, the first charging time and the second charging time being at least 500 times or more of the discharge time, including 600, 800, 1000, 1200, 1500 times or more.

The first capacitor has a first capacitance value and the second capacitor has a second capacitance value. The first frequency is dependent on the first capacitance value and the compensational leakage current. The second frequency is dependent on the second capacitance value and the compensational leakage current.

The device may comprise a first counter which is configured to receive and count data output of the first signal generator within a time period, a second counter which is configured to receive and count data output of the second signal generator within the time period, and a comparison circuit which is configured to give an actuation signal after comparing count results of the first counter and the second counter.

The compensation device introduces a leakage current path which is configured to contribute to equalizing the adverse effects of the leakage current of the ESD diode, and more particularly the adverse effects due to variation of leakage current of the ESD diode with temperature.

The electronic device plus the puff sensor in cooperation is configured to operate as a dual slope ADC. ADCs are typically formed monolithically on a single semiconductor wafer and comprises an ESD diode at its analog input terminal to provide against damage by electrostatic discharge.

FIGURES

Figure 1A:
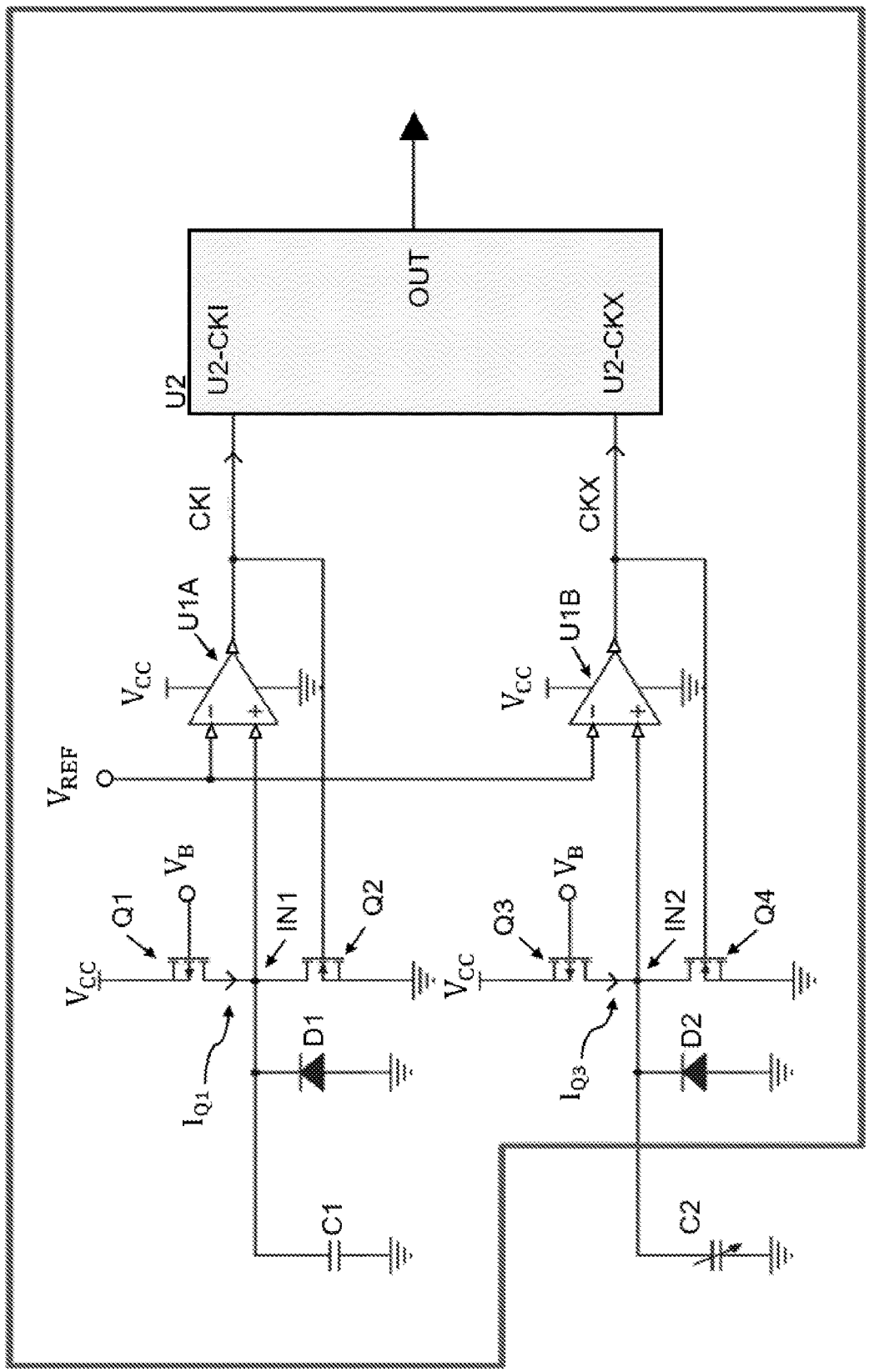
Figure 3:
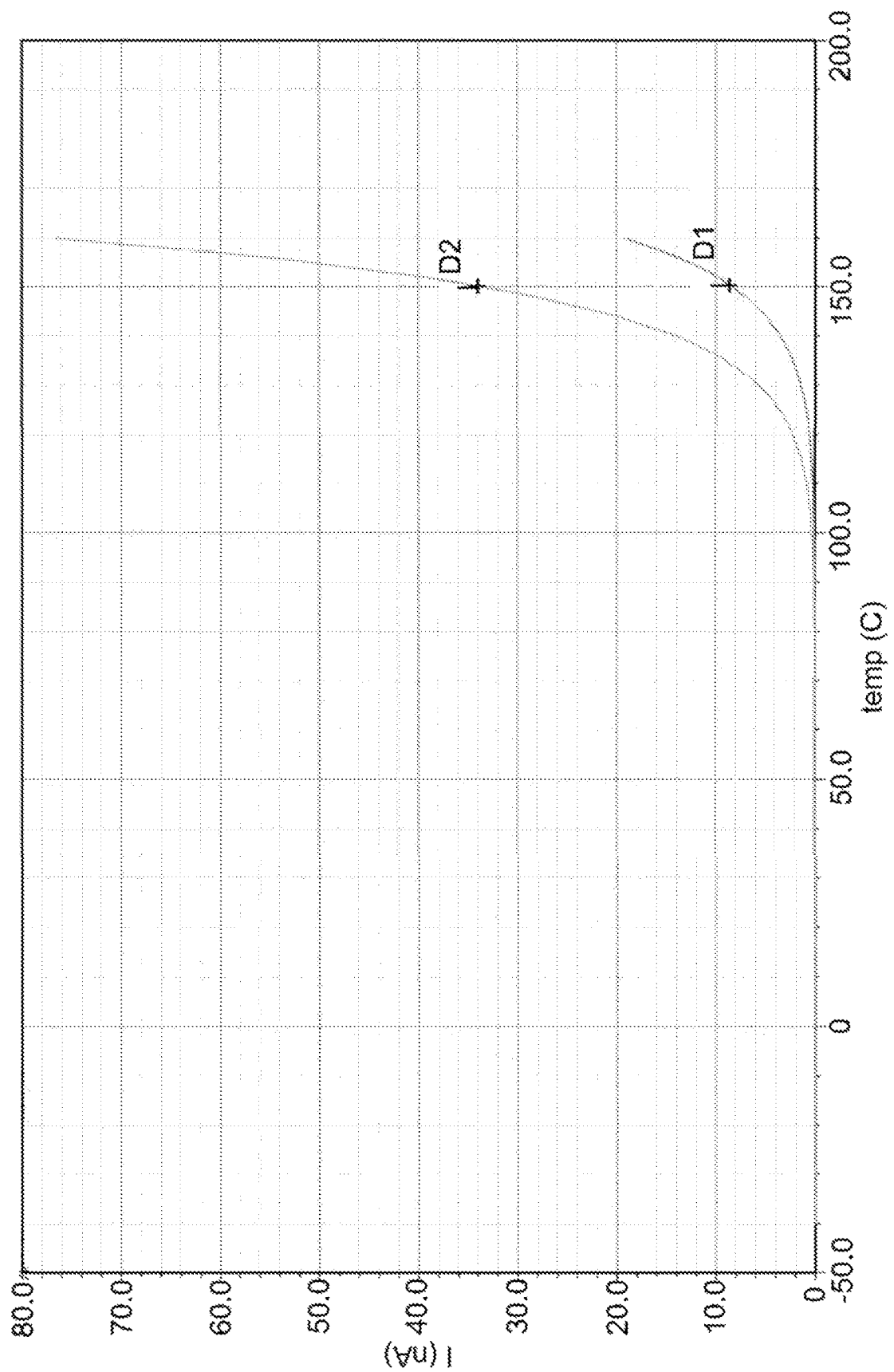
Figure 4:
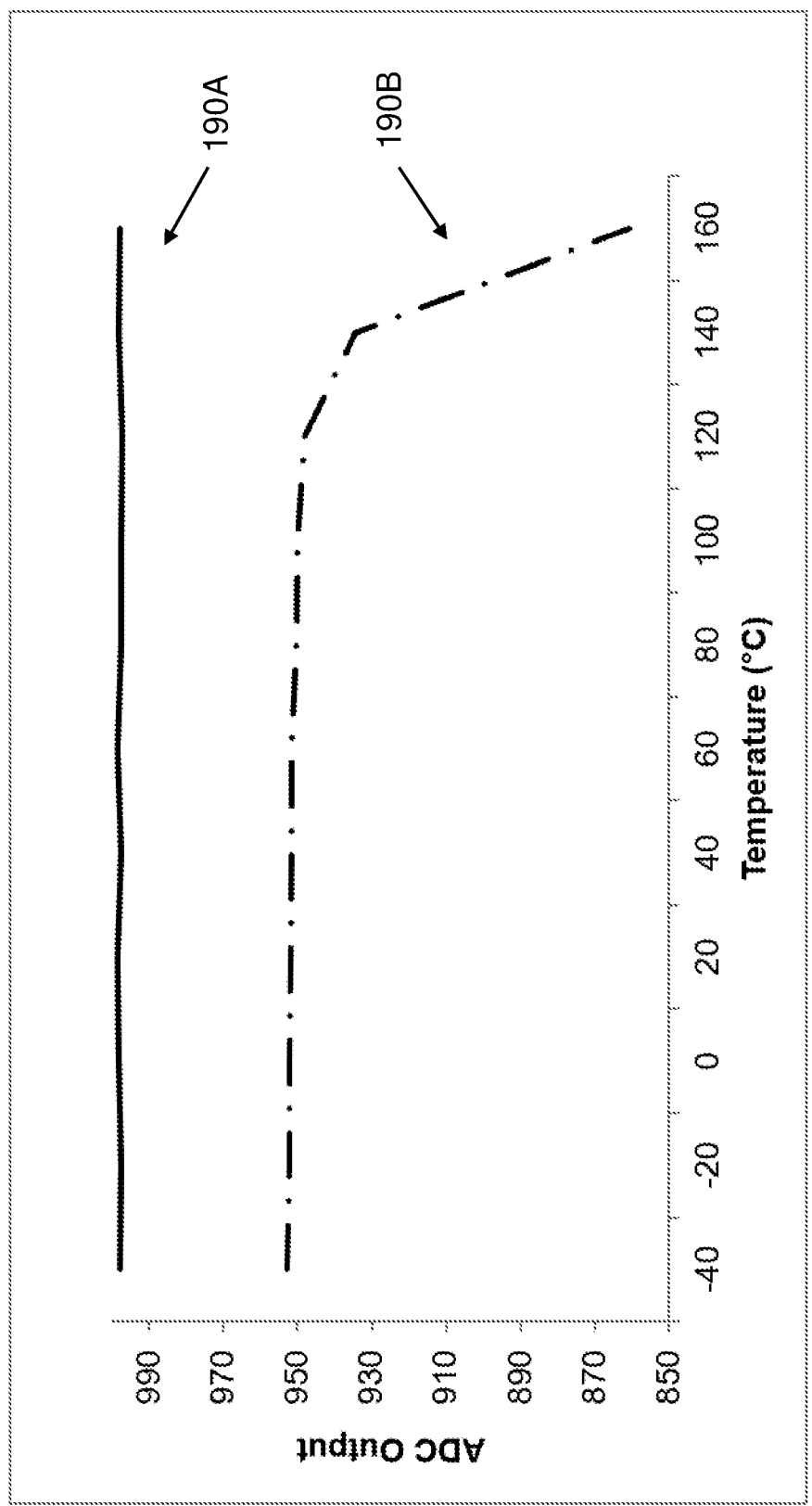

The present disclosure and its aspects and embodiments are described with reference to the accompanying figures, in which, FIG. 1 is a block diagram of a puff detection device according to the present disclosure, FIG. 1A is a schematic circuit diagram of an example puff detection device of FIG. 1, FIG. 2A1 is an example waveform diagram showing the variation of voltages at the intermediate node of the first signal generator during charging and discharging operations, FIG. 2A2 shows the output data waveform CKI of the first signal generator, FIG. 2B1 an example waveform diagram showing the variation of voltages at the input node of the puff signal generator during charging and discharging operations of the second signal generator, FIG. 2B2 shows the output data waveform CKX of the first signal generator, FIG. 3 shows leakage current characteristics of an example reference diode and example ESD diode at an example reverse biasing voltage of 3.6V, and FIG. 4 are graphs showing ADC counter output with (solid line) and without (broken line) a compensation device.

DESCRIPTION

An example electronic vaping apparatus comprises a housing having an air-passageway, a mouth piece connected to one end of the air-passageway, and a puff detection circuitry. The puff detection circuitry comprises a puff sensor and a detection circuitry which is electrically connected to the puff sensor. The puff sensor as a detection frontend is disposed in the puff passageway, usually distal from the mouth piece. The puff sensor is configured to sense an act of inhaling at the mouth piece. The air-passageway is configured such that an act of inhaling at the mouth piece will result in a flow of air along the air-passageway and towards the mouth piece. The flow of air will result in an instantaneous drop in air pressure inside the air-passageway. Therefore, the puff sensor may be an airflow sensor or a pressure sensor.

The detection circuit comprises a signal processing portion and a decision portion. The signal processing portion is a frontend portion which is configured to process an analog output signal of the puff sensor to generate a digital output data. The decision portion is configured to determine with reference to the digital output data of the signal processing portion whether a triggering event has been detected by the puff sensor. A triggering event may be set as an act of inhaling corresponding to a vaping inhaling. In signal output terms, a triggering event may be set as corresponding to a threshold signal output level of the puff sensor. For example, where the puff sensor is configured to detect airflow, the triggering event may be set to correspond to an airflow rate reaching a predetermined threshold. Where the puff sensor is configured to detect a drop in air pressure, the triggering event may be set to correspond to a drop in air pressure reaching a predetermined threshold or an air pressure reaching a threshold low-pressure level.

When a triggering event is detected, the detection circuit will output an actuation signal and the vaping apparatus will be actuated. When a vaping apparatus is actuated, a vapor, for example, a flavored vaping vapor, will be delivered into the air-passageway and further delivered to the mouth piece and reaching a user as a result of the act of inhaling. The vaping apparatus typically comprises a controller, a vaping source and a heater. The controller is usually configured to activate the heater whereby the vaping source is heated to release a vaping vapor upon receipt of an actuation signal.

An example puff detection arrangement 10 as shown in FIG. 1 comprises a detection circuit 100 and a puff sensor which is connected to the detection circuit 100. The detection circuit comprises a frontend portion and a decision portion. The frontend portion comprises a plurality of signal generators including a first signal generator 120 which is a reference signal generator configured to generate a reference signal and a second signal generator 140 which is a sensor signal generator configured to generate a sensor signal. Each signal generator is a pulse train generator which is to generate a train of pulses having a characteristic frequency, and each pulse has a characteristic pulse period T.

The decision portion 160 comprises a first input port which is connected to the output port of the reference signal generator, a second input port which is connected to the output port of the sensor signal generator, and a comparison circuit which is configured to compare the output signals of the first and second signal generators and to output a decision outcome based on the output signal comparison.

The decision outcome may have a first state which is a non-actuation state and a second state which is an actuation state. When no triggering event is detected at the puff sensor, the decision outcome of the decision portion will be in the first state. When a triggering event is detected at the puff sensor, the decision outcome of the decision portion will be in the second state. In general, the vaping apparatus on starting up will have the decision outcome in the non-actuation first state, and the decision outcome will be switched into the actuation second state when a triggering event has been detected.

An example first signal generator is a first pulse-train generator which comprises:
- a first capacitor which is a reference capacitor,
- a first charging-and-discharging circuit which is configured to repeatedly charge and discharge the first capacitor,
- a first switching device which is configured to switch the first charging-and-discharging circuit between a charging mode and a discharging mode, and
- a compensation device which is in parallel connection with the first capacitor.

The first charging-and-discharging circuit, the first switching device and the first capacitor are configured to cooperate to function as a reference oscillator to generate a first pulse train which is a reference pulse train having a first frequency which is a reference frequency corresponding to a first pulse count which is a reference pulse count. The reference frequency and the reference pulse count are characteristic of the reference capacitor.

The compensation device is a semiconductor device having leakage current characteristics which are similar to those of an ESD diode. The compensation device is configured to provide a compensational leakage current when the first capacitor is being charged by the first charging-and-discharging circuit operating in the charging mode. The compensational leakage current is variable and varies with the change in temperature of the compensational device.

An example second signal generator is a second pulse-train generator comprising:
- a sensor input node for connection with the puff sensor which is a capacitive sensor that is electrically equivalent to a second capacitor,
- a second charging-and-discharging circuit which is configured to repeatedly charge and discharge the second capacitor,
- a second switching device which is configured to switch the second charging-and-discharging circuit between a charging mode and a discharging mode, and
- a diode which is configured as an ESD diode at the sensor input node to provide electrostatic discharge (ESD) protection to the second signal generator.

The second capacitor, the second charging-and-discharging circuit and the second switching device are configured to cooperate to function as a detection oscillator to generate a second pulse train which is a detection pulse train having a second frequency which is a detection frequency corresponding to a second pulse count which is a detection pulse count.

Since an ESD diode is configured to provide ESD protection, the ESD diode has its cathode connected to the sensor input node and its anode connected to the circuit ground so that the ESD diode is under a reverse bias when the second capacitor is being charged by the second charging-and-discharging circuit operating in the charging mode.

The compensation device and the ESD diode may be monolithically formed on a single semiconductor wafer so that the leakage current versus temperature characteristics of the compensation device and the ESD diode are the same or follow the same trend.

A capacitive puff sensor typically comprises a puff detection surface which is to deform or move relative to a reference surface on encountering an act of inhaling. The surface deformation or movement may be towards or away from the reference surface. The reference surface may be tied to the circuit ground and has the potential of the circuit ground. The puff detection surface is a resilient surface which is to return to its neutral state when the force causing deformation or movement is no longer present. The puff sensor has an initial capacitance value, which is referred to as its neutral capacitance value, when there is no deformation or movement force. The puff sensor may be configured so that its capacitance value, measured between two terminals, is to gradually change from the neutral capacitance value on encountering an inhaling puff. The change in capacitance value may be positive or negative, depending on the disposition of the puff sensor. The capacitance value of the puff sensor is to return to its neutral capacitance value, when there is no airflow along the air passageway.

The decision portion 160 comprises a circuit arrangement which is configured to compare the data received from the first input port and the second input port and to determine with reference to the received data whether a triggering event has been detected by the puff sensor. If positive, the decision portion will output an actuation signal.

In example embodiments, the decision portion 160 comprises a plurality of pulse counters which is configured to count the number of reference pulses and the number of detection pulses within a predetermined or a prescribed time period, and to determine whether a triggering event has been detected with reference to the pulse counts.

For example, the first signal generator may be set to output a first number of counts within a prescribed time period as a first reference count, and the second signal generator may be set to output a second number of counts within the prescribed time period as a second reference count during a calibration process when there is no airflow through the air-passageway. The first reference count and the second reference count are correlated, for example, by a constant which is a real number. The decision portion 160 may be configured to generate an actuation signal if the detection count reaches a threshold count. The threshold count may be same as, above, or below the reference count.

For example, if the puff sensor is configured to decrease capacitance on encountering a vaping air flow, an increase in the number of detection count towards the threshold count is an indication of an airflow approaching a triggering event. On the other hand, if the puff sensor is configured to increase capacitance on encountering a vaping air flow, a decrease in the number of detection count towards the threshold count is an indication of an airflow approaching a triggering event.

Referring to FIGS. 1 and 1A, an example first signal generator 120 comprises a charging-and-discharging circuit, a mode switching device U1A, a reference capacitor C1 and a compensational device D1. The charging-and-discharging circuit comprises a charging circuit portion, a discharging circuit portion and an intermediate node IN1 interconnecting the charging circuit portion and the discharging circuit portion. The reference capacitor C1 has a first terminal which is connected to the intermediate node IN1 which is an interconnection node, and a second terminal which is connected to the circuit ground.

The charging circuit portion comprises a current source Q1 having a first terminal which is a current input terminal, a second terminal which is a current output terminal, and a current path interconnecting the first terminal and the second terminal. The current source has a third terminal which is a control terminal for controlling the amount of current which is to flow through the current path. The current input terminal of the current source Q1 is connected to a power supply rail which is at a supply voltage $V_{CC}$ and the current output terminal of the current source Q1 is connected to the intermediate node IN1.

The discharging circuit portion comprises a discharge switch Q2 having a first terminal which is a current input terminal, a second terminal which is a current output terminal, and a current path interconnecting the first terminal and the second terminal. The discharge switch has a third terminal which is a control terminal for controlling the operational state of the current switch. The discharge switch is operable in a first state which is an off-state in which the current path is non-conductive and a second state which is an on-state in which the current path is current conductive. The current input terminal of the discharge switch is connected to the intermediate node IN1 and the current output terminal of the discharge switch is connected to the circuit ground.

The mode switching device U1A comprises an input terminal and an output terminal. The input terminal of the mode switching device U1A is connected to the intermediate node IN1, and the output terminal of the mode switching device U1A is connected to the control terminal of the current switch. The mode switching device U1A is configured to have a bistate output, that is, an on output or an off output.

In the example of FIG. 1A, the current source Q1 is a p-channel MOSFET, the current input terminal of the current source Q1 is the source terminal of the MOSFET, the current output terminal of the current source Q1 is the drain terminal of the MOSFET, and the control terminal of the current source Q1 is the gate terminal of the MOSFET. The discharge switch Q2 is an n-channel MOSFET, the current input terminal of the discharge switch Q2 is the drain terminal of the MOSFET, the current output terminal of the discharge switch Q2 is the source terminal of the MOSFET, and the control terminal of the discharge switch Q2 is the gate terminal of the MOSFET. While the current source Q1 is a p-channel MOSFET and the discharge switch Q2 is an n-channel MOSFET in this example, it should be appreciated that the charging-and-discharging circuit can be constructed from other types of components without loss of generality. Likewise, the compensational device D1 is shown as a reference diode having its cathode terminal connected to the intermediate node IN1 and its anode terminal connected to the circuit ground. In general, a semiconductor having a p-n junction which is configured to operate under reversed bias during the charging cycle of the reference capacitor C1 would be equivalent without loss of generality.

The mode switching device U1A includes an analog signal input terminal which is connected to the intermediate node IN1 of the charging-and-discharging circuit, and a reference terminal which sets a reference value $V_{REF}$. The mode switching device U1A is configured to toggle its output state when the analog signal at its input terminal rises from a value below the reference value to reach the reference value. In the example of FIG. 1A, the mode switching device U1A gives an on-output when the analog signal at its input terminal is at or above the reference value $V_{REF}$ and gives an off-output when the analog signal at its input terminal is below the reference value. As the output of the mode switching device U1A is connected to the control terminal of the current source Q1, the discharge switch Q2 will be turned on to discharge the reference capacitor C1 when the analog signal at the input terminal of the mode switching device U1A has reached the reference value $V_{REF}$, and the discharge switch Q2 will be turned off to not to discharge the reference capacitor C1 when the analog signal at the input terminal of the mode switching device U1A is below reference value $V_{REF}$. The example mode switching device U1A of FIG. 1A is implemented by means of a comparator and persons skilled in the art would appreciate that other devices can be used to implement the same functions without loss of generality. The reference value $V_{REF}$ is selected to be a voltage value which is intermediate the supply voltage $V_{CC}$ and the ground potential without loss of generality.

Referring to FIG. 2A1, initially at time=0, the reference capacitor C1 has no charge, the voltage difference between the first and second terminals of the reference capacitor C1 is zero, the intermediate node IN1 is at ground potential of zero volt, the mode switching device U1A has an off-state output, the discharge switch Q2 is turned off, and the current source Q1 begins to deliver a current $I_{Q1}$. At time>0, the voltage at the intermediate node IN1 rises as a result of the charging of the reference capacitor C1. When the voltage at the intermediate node IN1 rises to a value equal to $V_{REF}$ at time t=$t_{RI}$, the mode switching device U1A will toggle to give an on-output, the discharge switch Q2 will be turned on, the current source Q1 will be turned off, and the charge on the reference capacitor C1 will be discharged to the circuit ground via the discharge switch Q2. The discharge process takes a period of time $\tau_{FI}=t_{FI}$ for the voltage of the reference capacitor C1 to drop from V=$V_{REF}$ to V=0.

When the voltage of the reference capacitor C1 has dropped to the ground potential, the discharge switch Q2 is turned off, the current source Q1 is turned on, and the reference capacitor C1 will be charged again until the voltage of the reference capacitor C1 reaches V=$V_{REF}$ in a period of time $\tau_{RI}=t_{RI}$. When the voltage of the reference capacitor C1 reaches V=$V_{REF}$, the reference capacitor C1 discharge process will occur and the charge and discharge process will repeat alternately. As a result, a train of reference pulses is generated. The train of reference pulses is formed of triangular pulses each having a rising hypotenuse and a right-angled falling edge. Adjacent triangular pulses are in abutment so that a rising edge is in abutment with a falling edge and a falling edge is in abutment with a rising edge. The triangular pulses cooperate to form a train of sawtooth pulses having a reference frequency $f_I$.

Thus, a complete cycle of charging and discharging of the reference capacitor C1 has a total cycle period $\tau_I$ equal to $t_{RI}+t_{FI}$, wherein $\tau_{FI}$ is a discharge time which is the time required for the reference capacitor C1 to discharge from $V_{REF}$ to the ground potential via the discharge switch, and $\tau_{RI}$ is a charge time which is the time required for the reference capacitor C1 to charge from the ground potential to $V_{REF}$ by the charging source. The cycle period $\tau_I=t_{RI}+t_{FI}=1/f_I$, where $f_I$ is the reference frequency.

The charging and discharging timing diagram of FIG. 2A1 is schematic and not in scale. In reality, the fall time $t_{FI}$ is very insignificant and negligible compared to the rise time $t_{RI}$. For example, the rise time $t_{RI}$ may be 1,000 times or more of the fall time, i.e., $t_{FI} \leq 0.1\%$ $t_{RI}$. In example embodiments, the fall time may be less than 100 ns, for example, 10 ns, 20 ns, 30 ns, 40 ns, 50 ns, 60 ns, 70 ns, 80 ns, 90 ns, 100 ns, or a range or ranges selected from a combination of any of the aforesaid values. The fall time is selected to be shorter than the response or reaction time of the mode switching device U1A so that the mode switching device U1A does not change its output state during the discharging cycle.

As shown in FIG. 2A2, the output data of the mode switching device U1A is a train of square pulses and each square pulse has a substantially constant voltage level during the entire discharging cycle. Each output data pulse of the mode switching device U1A has a substantially flat or levelled top because the duration of the discharging cycle is shorter than the reaction time of the mode switching device U1A and the mode switching device U1A does not react fast enough to change its output state during the discharge cycle even though the voltage at the intermediate node IN1 has fallen below $V_{REF}$. The output data of the mode switching device U1A may be regarded as a reference clock having a train of reference clock pulses CKI and a reference clock frequency $f_{CKI}$ where $f_{CKI}=f_I$.

The second signal generator 140 and a puff sensor are electrically coupled to form a puff signal generator. The puff sensor is a capacitive sensor which is electrically equivalent to a second capacitor C2 which is a sensing capacitor. The second signal generator 140 comprises a charging-and-discharging circuit, a mode switching device U1B, and an ESD diode D2. The charging-and-discharging circuit comprises a charging circuit portion, a discharging circuit portion and an intermediate node IN2 interconnecting the charging circuit portion and the discharging circuit portion. The second capacitor C2 has a first terminal which is connected to the intermediate node IN2 which is an interconnection node, and a second terminal which is connected to the circuit ground. The ESD diode D2 is for providing electrostatic discharge protection to the second signal generator 140 and is connected between the intermediate node IN2 and the circuit ground. More specifically, the ESD diode has its cathode terminal connected to the intermediate node IN2, which is an input node, and its anode terminal connected to the circuit ground.

The charging circuit portion comprises a current source Q3 having a first terminal which is a current input terminal, a second terminal which is a current output terminal, and a current path interconnecting the first terminal and the second terminal. The current source has a third terminal which is a control terminal for controlling the amount of current which is to flow through the current path. The current input terminal of the current source Q3 is connected to a power supply rail which is at a supply voltage $V_{CC}$ and the current output terminal of the current source Q3 is connected to the intermediate node IN2.

The discharging circuit portion comprises a discharge switch Q4 having a first terminal which is a current input terminal, a second terminal which is a current output terminal, and a current path interconnecting the first terminal and the second terminal. The discharge switch has a third terminal which is a control terminal for controlling the operational state of the current switch. The discharge switch is operable in a first state which is an off-state in which the current path is non-conductive and a second state which is an on-state in which the current path is current conductive. The current input terminal of the discharge switch is connected to the intermediate node IN2 and the current output terminal of the discharge switch is connected to the circuit ground.

The mode switching device U1B comprises an input terminal and an output terminal. The input terminal of the mode switching device U1B is connected to the intermediate node IN2, and the output terminal of the mode switching device U1B is connected to the control terminal of the current switch. The mode switching device U1B is configured to have a bistate output, that is, an on output or an off output.

In FIG. 1A, the example current source Q3 is a p-channel MOSFET, the current input terminal of the current source Q3 is the source terminal of the MOSFET, the current output terminal of the current source Q3 is the drain terminal of the MOSFET, and the control terminal of the current source Q3 is the gate terminal of the MOSFET. The example discharge switch Q4 is an n-channel MOSFET, the current input terminal of the discharge switch Q4 is the drain terminal of the MOSFET, the current output terminal of the discharge switch Q4 is the source terminal of the MOSFET, and the control terminal of the discharge switch Q4 is the gate terminal of the MOSFET.

The mode switching device U1B includes an analog signal input terminal which is connected to the intermediate node IN2 of the charging-and-discharging circuit, and a reference terminal which sets a reference value $V_{REF}$. The mode switching device U1B is configured to toggle its output state when the analog signal at its input terminal rises from a value below the reference value to reach the reference value. In the example of FIG. 1A, the mode switching device U1B gives an on-output when the analog signal at its input terminal is at or above the reference value $V_{REF}$ and gives an off-output when the analog signal at its input terminal is below the reference value. As the output of the mode switching device U1B is connected to the control terminal of the current source Q3, the discharge switch Q4 will be turned on to discharge the sensing capacitor C2 when the analog signal at the input terminal of the mode switching device U1B has reached the reference value $V_{REF}$, and the discharge switch Q4 will be turned off to not to discharge the sensing capacitor C2 when the analog signal at the input terminal of the mode switching device U1B is below reference value $V_{REF}$. The example mode switching device U1B of FIG. 1A is implemented by means of a comparator and persons skilled in the art would appreciate that other devices can be used to implement the same functions without loss of generality.

Referring to FIG. 2B1, initially at time=0, the sensing capacitor C2 has no charge, the voltage difference between the first and second terminals of the sensing capacitor C2 is zero, the intermediate node IN2 is at ground potential of zero volt, the mode switching device U1B has an off-state output, the discharge switch Q4 is turned off, and the current source Q3 begins to deliver a current $I_{Q3}$. At time>0, the voltage at the intermediate node IN2 rises as a result of the charging of the sensing capacitor C2. When the voltage at the intermediate node IN2 rises to a value equal to $V_{REF}$ at time $t=t_{RX}$, the mode switching device U1B will toggle to give an on-output, the discharge switch Q4 will be turned on, the current source Q3 will be turned off, and the charge on the sensing capacitor C2 will be discharged to the circuit ground via the discharge switch Q4. The discharge process takes a period of time $\tau_{FX}=t_{FX}$ for the voltage of the sensing capacitor C2 to drop from $V=V_{REF}$ to $V=0$.

When the voltage of the sensing capacitor C2 has dropped to the ground potential, the discharge switch Q4 is turned off, the current source Q3 is turned on, and the sensing capacitor C2 will be charged again until the voltage of the sensing capacitor C2 reaches $V=V_{REF}$ in a period of time $\tau_{RX}=t_{RX}$. When the voltage of the sensing capacitor C2 reaches $V=V_{REF}$, the sensing capacitor C2 discharge process will occur and the charge and discharge process will repeat alternately. As a result, a train of sensor pulses comprising a plurality of sensor pulses is generated, and each sensing pulse is a detection pulse. The train of sensor pulses is formed of triangular pulses each having a rising hypotenuse and a right-angled falling edge. Adjacent triangular pulses are in abutment so that a rising edge is in abutment with a falling edge and a falling edge is in abutment with a rising edge. The triangular pulses cooperate to form a train of sawtooth pulses having a detection frequency $f_X$.

Thus, a complete cycle of charging and discharging of the sensing capacitor C2 has a total cycle period $\tau_X$ equal to $t_{RX}+t_{FX}$, wherein $\tau_{FX}$ is a discharge time which is the time required for the sensing capacitor C2 to discharge from $V_{REF}$ to the ground potential via the discharge switch, and $\tau_{RX}$ is a charge time which is the time required for the sensing capacitor C2 to charge from the ground potential to $V_{REF}$ by the current source. The cycle period $\tau_X = t_{RX}+t_{FX}=1/f_X$, where $f_X$ is the detection frequency.

The charging and discharging timing diagram of FIG. 2B1 is schematic and not in scale. In reality, the actual fall time $t_{FX}$ is very insignificant and negligible compared to the rise time $t_{RI}$. For example, the rise time $t_{RX}$ may be 1,000 times or more of the fall time, i.e., $t_{FX} \leq 0.1\%$ $t_{RX}$. In example embodiments, the fall time may be less than 100 ns, for example, 10 ns, 20 ns, 30 ns, 40 ns, 50 ns, 60 ns, 70 ns, 80 ns, 90 ns, 100 ns, or a range or ranges selected from a combination of any of the aforesaid values. The fall time is selected to be shorter than the response or reaction time of the mode switching device U1B so that the mode switching device U1B does not change its output state during the discharging cycle.

As shown in FIG. 2B2, the output data of the mode switching device U1B is a train of square pulses and each square pulse has a substantially constant voltage level during the entire discharging cycle. Each output data pulse of the mode switching device U1B has a substantially flat or levelled top because the duration of the discharging cycle is shorter than the reaction time of the mode switching device U1B and the mode switching device U1B does not react fast enough to change its output state during the discharge cycle even though the voltage at the intermediate node IN2 has fallen below $V_{REF}$. The output data of the mode switching device U1B may be regarded as a detection clock having a train of detection clock pulses CKX and a detection clock frequency $f_{CKX}$ where $f_{CKX}=f_X$.

The charging time or rise time $\tau_{RI}$, $\tau_{RX}$ of the capacitor $C_1$, $C_2$ is dependent on the charging current value, the capacitance value of the capacitor being charged, and the switching voltage $V_{REF}$, which is also referred to as a discharge activation voltage since it is the threshold voltage at which the switching device U1A, U1B is to generate a discharge signal to the discharge switch Q2, Q4.

For the reference signal generator, the rise time $\tau_{RI}$ relates to the capacitor charging current $I_{C1}$, the capacitance value $C_{REF}$ of the reference capacitor C1 and the switching voltage by expression (1) below:

$$\tau_{RI} = \frac{V_{REF} \times C_{REF}}{I_{C1}} \approx 1/f_{CKI} \qquad \text{(Expression 1)}$$

For the detection signal generator, the rise time $\tau_{RX}$ relates to the capacitor charging current $I_{C2}$, the instantaneous capacitance value $C_{SENSOR}$ of the sensing capacitor C2 and the switching voltage by expression (2) below:

$$\tau_{RX} = \frac{V_{REF} \times C_{SENSOR}}{I_{C2}} \approx 1/f_{CKX} \qquad \text{(Expression 2)}$$

Since the capacitance value of the puff sensor will change when there is an act of inhaling, and the amount of change is commensurate with the strength of inhaling, the instantaneous capacitance value or the instantaneous change in capacitance value can be used as a detection parameter to determine whether a valid act of inhaling corresponding to a vaping puff has been detected to signal vaping actuation.

For example, a vaping puff can be considered as detected if the change in capacitance value of the puff sensor has reached m % of its static capacitance value, and m is a real number which may be selected according to the deformation properties of the puff sensor. In example embodiments, m can be between 1.5% and 4%, for example, between 1.6% and 3.2%.

A possible method of detection is to compare the number of detection pulses and the number of reference pulses in a prescribed time period to determine whether there is a valid act of inhaling, because the number of detection pulses in a prescribed time is commensurate with the instantaneous capacitance value of the puff sensor.

In example embodiments, the sensing capacitor is selected to have a capacitance value which is several times the capacitance value of the reference capacitor to make puff detection more noticeable, efficient and/or reliable. For example, the sensing capacitor may have a capacitance value which is n times the capacitance value of the reference capacitor so that $C_{SENSOR}=nC_{REF}$, where n is a real number which may have a value of between 1 and 10. In some applications, the sensing capacitor may have a capacitance value which is smaller than that of the reference capacitor in which case n is a real number which may be between 0.1 and 1.

So that the sensing capacitor and the reference capacitor can be charged up in approximately the same charging time $\tau_R$, the charging circuit portions are often configured such that the second current $I_{Q3}$ is n times the first current $I_{Q1}$. For example, the first current source Q1 is configured to deliver a first current of 0.1 µA and the second current source Q3 is configured to deliver a second current of 0.4 µA.

So that the first and second current sources can be conveniently controlled by a single control signal $V_B$ which is a biasing voltage in the example circuit embodiments, the current sources Q1, Q3 are configured such that the MOSFET of the second current source Q3 has a p-n junction area which is n times the p-n junction area of the MOSFET of the first current source Q3. Since the discharge switches Q2, Q4 are configured to facilitate total discharge of the sensing capacitor and the reference capacitor in approximately the same discharge time, and the discharge times have to be shorter than the response times of the corresponding switching device U1A, U1B, the first and second discharge circuit portions are configured such that the second discharge switch Q4 is a MOSFET having a p-n junction area which is n times the p-n junction area of the MOSFET of the first discharge switch Q2. As the compensation device is configured to compensate for errors due to leakage current of the ESD diode, the compensation device D1 may be configured to have a p-n junction area which is also n times the p-n junction area of the ESD diode D2.

In example embodiments, the ADC or the first and second signal generators are monolithically formed on a single wafer as a single chip, and the various p-n junction areas can be defined accurately without undue difficulty.

Referring to FIG. 3, which shows the leakage current characteristics of an example compensation device D1 and an example ESD diode D2 having a p-n junction area ratio of 1:4, it is noted that the leakage currents of both diodes rise very rapidly when the temperature rises above an elevated operational temperature of around 120 degrees Celsius, and has a leakage current between D1 and D2 of 1:4 at the elevated operational temperature of 150 degrees Celsius. As shown in FIG. 3, the reference diode D1 has a leakage current of about 8.65 nA and the ESD diode D2 has a leakage current of about 34.0 nA at +150° C.

The decision portion 160 comprises an example circuit arrangement U2 including a first counter which is connected to a first input U2-CKI, a second counter which is connected to a second input U2-CKX, and a comparison circuit which is configured to compare the numbers of counts of pulses which are received at the first input and the second input, and to generate an actuation signal when the difference in the number of counts in a predetermined period corresponds to or exceeds a threshold number.

In the example of FIG. 1A, the first input of the decision portion 160 is connected to the data output of the first signal generator 120 and the second input is connected to the data output of the second signal generator 140. In an example embodiment, the puff sensor has a static capacitance value of 15 pF and the detection circuit when subject to no act of inhaling has measurement results set out in Table 1.

TABLE 1

| Temperature (° C.) | detection pulse period (us) | reference pulse period (us) | ADC counter output | Relative drift |
|---|---|---|---|---|
| −40 | 80.720 | 82.843 | 997.76 | 0.00% |
| −20 | 78.682 | 80.777 | 997.44 | −0.03% |
| 0 | 77.036 | 79.047 | 997.95 | 0.02% |
| 20 | 75.760 | 77.712 | 998.28 | 0.05% |
| 40 | 74.912 | 76.896 | 997.58 | −0.02% |
| 60 | 74.636 | 76.562 | 998.24 | 0.05% |
| 80 | 74.932 | 76.917 | 997.57 | −0.02% |
| 100 | 75.907 | 77.916 | 997.60 | −0.02% |
| 120 | 77.847 | 79.935 | 997.25 | −0.05% |
| 140 | 81.662 | 83.796 | 997.92 | 0.02% |
| 160 | 92.266 | 94.679 | 997.90 | 0.01% |

The ADC counter output set out in the last column of Table 1 is the number of detection pulses counted per a predetermined number of reference pulses, which is 1,024 in the example of Table 1. The pulse period time of Table 1 is the time of two pulses. The ADC counter output as tabulated in Table 1 is shown in the upper portion of FIG. 4 and in a solid line 190A. The ADC counter output is substantially constant in the entire operational temperature range of the detection circuit.

Table 2 below sets out corresponding measurement results of a puff detection device which is identical to the puff detection device of FIG. 1A, but without the compensation device D1.

TABLE 2

| Temperature (° C.) | detection pulse period (us) | reference pulse period (us) | ADC counter output | Relative drift |
|---|---|---|---|---|
| −40 | 77.078 | 82.829 | 952.90 | 0.00% |
| −20 | 75.110 | 80.765 | 952.30 | −0.06% |
| 0 | 73.493 | 79.049 | 952.03 | −0.09% |
| 20 | 72.254 | 77.738 | 951.76 | −0.12% |
| 40 | 71.422 | 76.871 | 951.41 | −0.16% |
| 60 | 71.135 | 76.558 | 951.46 | −0.15% |
| 80 | 71.371 | 76.913 | 950.22 | −0.28% |
| 100 | 72.285 | 77.917 | 949.98 | −0.31% |
| 120 | 74.006 | 79.927 | 948.14 | −0.50% |
| 140 | 76.488 | 83.826 | 934.36 | −1.95% |
| 160 | 79.606 | 94.709 | 860.71 | −9.68% |

TABLE 2-continued

| Temperature (° C.) | detection pulse period (us) | reference pulse period (us) | ADC counter output | Relative drift |
|---|---|---|---|---|

The ADC counter output as tabulated in Table 2 is shown in the lower portion of FIG. 4 and in a broken line 190B. It is observed that the ADC counter output is substantially constant in the operational temperature range of below 100° C., but begin to fall more rapidly when the operational temperature rises above 100° C. and beyond. The fall, which is a negative drift, indicates that the rise time per cycle under static conditions increases with temperature. Since a larger rise time cycle would indicate a larger capacitance value, the apparent increase in capacitance value may be interpreted by a controller as a triggering signal and may result in false or unexpected triggering of a vaping apparatus. In examples where a fall in capacitance value to a threshold value is taken as a triggering signal by a controller, the apparent increase in capacitance value may result in non-triggering when triggering is intended. Therefore, the puff detection device of the present disclosure provides a more promising and reliable puff detection device.

It is noted that the instantaneous capacitance value $C_{SENSOR}$ of the sensing capacitor C2 can be related to the capacitance value C REF by the expression:

$$C_{SENSOR} = n \times C_{REF} \times \frac{t_{RX}}{t_{RI}},$$

where $n=I_{C2}/I_{C1}$ is the ratio between the charging currents of the sensor capacitor C2 and the reference capacitor C1.

During the charging cycle of the sensing capacitor C2, the second current source Q3 is to deliver a second current $I_{Q3}$ to the input node IN2. However, not all of the second current $I_{Q3}$ delivered by the second current source Q3 could reach the sensing capacitor C2, since a portion of the delivered current will be lost as leakage currents which sink through various p-n junctions in reversed bias, including the ESD diode and the second discharge switch Q4 which is in the off-state during the charging cycle etc. In other words, $I_{Q3}=I_{C2}+I_{LEAK2}$, where $I_{Q3}$ is the second current delivered by the current source Q3, $I_{C2}$ is the current delivered to the sensing capacitor C2, and $I_{LEAK2}$ is the total leakage current loss in the second charging circuit of the second signal generator.

During the charging cycle of the reference capacitor C1, the current source Q1 is to deliver a first current $I_{Q1}$ to the intermediate node IN1. However, not all of the first current $I_{Q1}$ delivered by the first current source Q1 could reach the reference capacitor C1, since a portion of the delivered current will be lost as leakage currents which sink through various p-n junctions in reversed bias, including the compensation device D1, the first discharge switch Q2 which is in the off-state during the charging cycle and etc. In other words, $I_{Q1}=I_{C1}+I_{LEAK1}$, where $I_{Q1}$ is the first current delivered by the first current source Q1, $I_{C1}$ is the current delivered to the reference capacitor C1, and $I_{LEAK1}$ is the total leakage current lost in the first charging circuit of the first signal generator.

Since $I_{C1} \neq I_{Q1}$ and $I_{C2} \neq I_{Q3}$ due to leakage of current through various p-n junctions, the compensation device provides a dynamic compensation leakage current which contributes to mitigate detection errors which arises due to operation of the puff detection circuitry at an elevated operational temperature.

In example applications, the puff detection device is mounted inside a tubular housing to provide puff detection signals for operation of an electronic vaping apparatus such as electronic cigarettes.

While the present disclosure has been made with reference to embodiments and examples described herein, it should be appreciated that the embodiments and examples are non-limiting and should not be construed to limit the scope of disclosure.

For example, while the compensation device is shown as a diode, the compensational device may be any semiconductor having a reversed bias p-junction during the charging cycles.

The invention claimed is:

1. An electronic device comprising a first signal generator and a second signal generator,
    wherein the first signal generator is a reference signal generator comprising:
        a first capacitor which is a reference capacitor connected between an intermediate node and a circuit ground, and
        a compensation device which is connected in parallel with the first capacitor;
        a first charging-and-discharging circuit which is configured to repeatedly charge and discharge the first capacitor whereby a first train of pulses having a first frequency is generated, the first frequency being a reference frequency corresponding to a first pulse count which is a reference pulse count; and
        wherein the first charging-and-discharging circuit comprises a first charging circuit portion which is configured to supply a first current to the intermediate node whereby the first capacitor is charged;
    wherein the second signal generator is a detection signal generator comprising:
        an input node which is configured for making electrical connection with a capacitive sensor which is a second capacitor,
        a diode which is connected at the input node to function as an ESD diode to provide electrostatic discharge protection,
        a second charging-and-discharging circuit which is configured to repeatedly charge and discharge the second capacitor whereby a second train of pulses having a second frequency is generated when the capacitive sensor is connected to the second signal generator, the second frequency being a detection frequency corresponding to a second pulse count which is a detection pulse count; and
    wherein the compensation device is configured to provide a leaking current path so that a minor portion of the first current is to flow into the compensation device as a compensational leakage current during charging cycles of the first charging circuit portion to mitigate errors arising from a change in leakage current of the ESD diode due to a change in operational temperature of the second signal generator.

2. The device of claim 1, wherein the device is configured for operating in an elevated operation temperature range including 100 degrees Celsius and above, wherein the ESD diode has a leaking-current-versus-temperature trend, and wherein the compensation device has a leaking-current-versus-temperature trend which follows the leaking-current-versus-temperature trend of the ESD diode in the elevated operation temperature range.

3. The device of claim 1, wherein the compensation device has a semiconductor p-n junction which is configured to operate under a reversed bias when the first charging circuit portion is in a charging cycle during which the first capacitor is charged.

4. The device of claim 1, wherein the compensation device is configured as a diode having its cathode connected to the intermediate node and its anode connected to the circuit ground.

5. The device of claim 1, wherein the compensation device and the ESD diode are monolithically formed on a single semiconductor chip.

6. The device of claim 1, wherein the compensation device is configured such that the leakage current of the ESD diode is n times the compensational leakage current of the compensation device at an elevated operation temperature of above 100 degrees Celsius, n being a positive real number between 1 and 10, including 1, 2, 3, 4, 5, 6, 7, 8, 9, 10 and a range or ranges selected from any combination of the afore-values.

7. The device of claim 6, wherein the compensation device has a p-n junction having a first p-n junction area and the ESD diode has a second p-n junction area, and wherein the second p-n junction area is n times the first p-n junction area.

8. The device of claim 6, wherein the second charging-and-discharging circuit comprises a second charging circuit portion which is configured to supply a second current to the input node whereby the second capacitor which is a sensing capacitor is charged, the second current being m times the first current and m being a positive real number between 1 and 10, including 1, 2, 3, 4, 5, 6, 7, 8, 9, 10 and a range or ranges selected from any combination of the afore-values;
    wherein m is ±5%, ±10%, ±15%, or ±20% of n; or n is ±5%, ±10%, ±15%, or ±20% of m.

9. The device of claim 1, wherein the second charging-and-discharging circuit comprises a second charging circuit portion which is configured to supply a second current to the input node whereby the second capacitor which is a sensing capacitor is charged, the second current being m times the first current and m being a positive real number between 1 and 10, including 1, 2, 3, 4, 5, 6, 7, 8, 9, 10 and a range or ranges selected from any combination of the afore-values.

10. The device of claim 9, wherein the first charging circuit portion comprises a first current source having a first p-n junction area, and wherein the second charging circuit portion comprises a second current source having a second p-n junction area which is m times the first p-n junction area.

11. The device of claim 1, wherein the first charging-and-discharging circuit comprises a first discharging circuit portion including a first discharge switch which is configured to discharge the reference capacitor in a discharge time, wherein the device comprises a first switching device which is configured to activate the first discharge switch to discharge the reference capacitor when a discharge voltage appears at the intermediate node, and wherein the switching device has a response time, and the discharge time is smaller than the response time.

12. The device of claim 11, wherein the second charging-and-discharging circuit comprises a second charging circuit portion which is configured to supply a second current to the input node whereby the second capacitor which is a sensing capacitor is charged; and wherein the discharge time is 20 ns or lower, and wherein the first charging circuit portion is configured to charge the first capacitor in a first charging time and the second charging circuit portion is configured to charge the second capacitor in a second charging time, the first charging time and the second charging time bring at least 1000 times of the discharge time.

13. The device of claim 1, wherein the second charging-and-discharging circuit comprises a second discharging circuit portion including a second discharge switch which is configured to discharge the sensing capacitor in a discharge time, wherein the device comprises a second switching device which is configured to activate the second discharge switch to discharge the sensing capacitor when a discharge voltage appears at the input node, and wherein the second switching device has a response time which is larger than the discharge time.

14. The device of claim 1, wherein the first capacitor has a first capacitance value and the second capacitor has a second capacitance value, wherein the first frequency is dependent on the first capacitance value and the compensational leakage current, and wherein the second frequency is dependent on the second capacitance value and the compensational leakage current.

15. The device of claim 1, wherein the device comprises a first counter which is configured to receive and count data output of the first signal generator within a time period, a second counter which is configured to receive and count data output of the second signal generator within the time period, and a comparison circuit which is configured to give an actuation signal after comparing count results of the first counter and the second counter.

16. A puff detection apparatus comprising an electronic device and a capacitive puff sensor, wherein the puff sensor is connected to the device as the second capacitor; wherein the electronic device comprises a first signal generator and a second signal generator,
wherein the first signal generator is a reference signal generator comprising:
a first capacitor which is a reference capacitor connected between an intermediate node and a circuit ground, and
a compensation device which is connected in parallel with the first capacitor;
a first charging-and-discharging circuit which is configured to repeatedly charge and discharge the first capacitor whereby a first train of pulses having a first frequency is generated, the first frequency being a reference frequency corresponding to a first pulse count which is a reference pulse count; and
wherein the first charging-and-discharging circuit comprises a first charging circuit portion which is configured to supply a first current to the intermediate node whereby the first capacitor is charged;
wherein the second signal generator is a detection signal generator comprising:
an input node which is configured for making electrical connection with a capacitive sensor which is a second capacitor,
a diode which is connected at the input node to function as an ESD diode to provide electrostatic discharge protection,
a second charging-and-discharging circuit which is configured to repeatedly charge and discharge the second capacitor whereby a second train of pulses having a second frequency is generated when the capacitive sensor is connected to the second signal generator, the second frequency being a detection frequency corresponding to a second pulse count which is a detection pulse count; and
wherein the compensation device is configured to provide a leaking current path so that a minor portion of the first current is to flow into the compensation device as a compensational leakage current during charging cycles of the first charging circuit portion to mitigate errors arising from a change in leakage current of the ESD diode due to a change in operational temperature of the second signal generator.

17. A vaping apparatus comprising a housing defining an air-passageway and a mouth piece on an end of the air-passageway, and a puff detection apparatus comprising an electronic device and a capacitive puff sensor, wherein the puff sensor is connected to the device as the second capacitor; wherein the electronic device comprises a first signal generator and a second signal generator,
wherein the first signal generator is a reference signal generator comprising:
a first capacitor which is a reference capacitor connected between an intermediate node and a circuit ground, and
a compensation device which is connected in parallel with the first capacitor;
a first charging-and-discharging circuit which is configured to repeatedly charge and discharge the first capacitor whereby a first train of pulses having a first frequency is generated, the first frequency being a reference frequency corresponding to a first pulse count which is a reference pulse count; and
wherein the first charging-and-discharging circuit comprises a first charging circuit portion which is configured to supply a first current to the intermediate node whereby the first capacitor is charged;
wherein the second signal generator is a detection signal generator comprising:
an input node which is configured for making electrical connection with a capacitive sensor which is a second capacitor,
a diode which is connected at the input node to function as an ESD diode to provide electrostatic discharge protection,
a second charging-and-discharging circuit which is configured to repeatedly charge and discharge the second capacitor whereby a second train of pulses having a second frequency is generated when the capacitive sensor is connected to the second signal generator, the second frequency being a detection frequency corresponding to a second pulse count which is a detection pulse count; and
wherein the compensation device is configured to provide a leaking current path so that a minor portion of the first current is to flow into the compensation device as a compensational leakage current during charging cycles of the first charging circuit portion to mitigate errors arising from a change in leakage current of the ESD diode due to a change in operational temperature of the second signal generator.

* * * * *